(12) United States Patent
Zhang

(10) Patent No.: US 6,448,773 B1
(45) Date of Patent: Sep. 10, 2002

(54) METHOD AND SYSTEM FOR MEASURING AND COMPENSATING FOR EDDY CURRENTS INDUCED DURING NMR IMAGING OPERATIONS

(75) Inventor: Weiguo Zhang, Foster City, CA (US)

(73) Assignee: Toshiba America MRI, Inc., Tustin, CA (US)

( * ) Notice: Subject to any disclaimer, the term of this patent is extended or adjusted under 35 U.S.C. 154(b) by 0 days.

(21) Appl. No.: 09/512,323

(22) Filed: Feb. 24, 2000

(51) Int. Cl.$^7$ .................................................. G01V 3/00
(52) U.S. Cl. ........................................ 324/309; 324/307
(58) Field of Search ................................ 324/300, 306, 324/307, 309, 312, 314, 318, 322

(56) References Cited

U.S. PATENT DOCUMENTS

| | | | |
|---|---|---|---|
| 4,698,591 A | 10/1987 | Glover et al. ............... | 324/307 |
| 4,885,542 A | 12/1989 | Yao et al. .................... | 324/313 |
| 4,924,186 A * | 5/1990 | Kawamoto et al. ......... | 324/320 |
| 4,950,994 A | 8/1990 | Glover et al. ............... | 324/320 |

(List continued on next page.)

Primary Examiner—Louis Arana
(74) Attorney, Agent, or Firm—Nixon & Vanderhye P.C.

(57) ABSTRACT

A method and apparatus is disclosed for measuring and compensating the effects of eddy currents induced during NMR imaging operations. A cubic or cylindrical sample is placed in the imaging volume of a MRI system at a position centrally located with respect to the main magnetic field and oriented with its longitudinal axis parallel to a desired measuring direction. A magnetic field gradient pulse is applied for inducing eddy currents as well as for generating a slice-selective spin-echo signal. The spin-echo signal is acquired immediately after the termination of each eddy-current inducing gradient pulse. Two slices are selected along the desired measurement direction at symmetrical equal distance from the center of the main magnetic field. Two spin-echo signals are acquired for each slice with the polarity of the eddy-current inducing gradient pulse reversed between the two echo signals. Quantitative values for eddy-current induced field gradients and $B_0$ oscillations are determined based on the precessing frequencies of the acquired NMR signals. NMR imaging is improved by compensating for eddy currents effects by applying the quantified values of the field gradients and $B_0$ oscillations to set an appropriate pre-emphasis network. Gradient pulses in MRI/MRS pulse sequences may also be selectively pre-distorted or modified to compensate for resulting gradient-switching induced eddy currents. Other aspects of the disclosed method include measuring the time course of gradient switching, altering the pulse sequences to measure eddy currents having long time constants, repeatedly measuring the eddy currents to assist in pre-emphasis adjustments, and measuring EC-induced field gradients and $B_0$ oscillation in the presence of moderately large background field inhomogeneities.

17 Claims, 10 Drawing Sheets

U.S. PATENT DOCUMENTS

| | | | |
|---|---|---|---|
| 4,965,521 A | 10/1990 | Egloff .......................... | 324/312 |
| 4,970,457 A | 11/1990 | Kaufman et al. ............ | 324/309 |
| 4,978,919 A | * 12/1990 | Hinks .......................... | 324/313 |
| 5,151,656 A | 9/1992 | Maier et al. ................ | 324/309 |
| 5,289,127 A | 2/1994 | Doddrell et al. ............ | 324/314 |
| 5,355,086 A | 10/1994 | Ratzel ......................... | 324/309 |
| 5,450,010 A | 9/1995 | Van der Meulen et al. . | 324/309 |
| 5,455,512 A | 10/1995 | Green et al. ................ | 324/309 |
| 5,493,224 A | 2/1996 | Shiono et al. .............. | 324/309 |
| 5,647,362 A | 7/1997 | Fuderer et al. ........... | 128/653.2 |
| 5,672,969 A | 9/1997 | Zhou et al. ................. | 324/309 |
| 5,770,943 A | 6/1998 | Zhou .......................... | 324/307 |
| 5,864,233 A | 1/1999 | Zhou et al. ................. | 324/309 |
| 6,127,826 A | * 10/2000 | Thompson et al. ......... | 324/307 |

OTHER PUBLICATIONS

Wysong et al, "A Simple Method of Measuring Gradient Induced Eddy Currents to Set Compensation Networks", Pittsburgh NMR Center for Biomedical Research, Carnegie Mellon University; and the Department of Physics and Astronomy, University of Pittsburgh, Pittsburgh, Pennsylvania, Copyright 1993 by Williams and Wilkins.

Liu et al, "Quantitative Characterization of the Eddy Current Fields in a 40–cm Bore Superconducting Magnet", Department of Physics and Applied Sciences in Medicine (P.S.A.), University of Alberta, Edmonton, Alberta, Canada, Copy right 1994 by Williams and Wilkins.

Boesch et al, "Temporal and Spatial Analysis of Fields generated by Eddy Currents in Superconducting Magnets: Optimization of Corrections and Quantitative Characterization of Magnet/Gradient Systems", *Magnetic Resonance in Medicine* 20, 268–284 (1991).

Yamamoto et al, "Gradient time–shape measurement by NMR", *J. Phys. E: Sci. Instrum*, 19 (1986).

* cited by examiner

METHOD AND SYSTEM FOR MEASURING AND COMPENSATING FOR EDDY CURRENTS INDUCED DURING NMR IMAGING OPERATIONS

FIELD OF THE INVENTION

This invention relates generally to nuclear magnetic resonance (NMR) imaging techniques. More particularly, it relates to methods for quantitatively measuring and compensation for eddy currents induced as a result of field gradient switching in magnetic resonance imaging (MRI) systems.

BACKGROUND OF THE INVENTION

Magnetic Resonance Imaging (MRI), having its roots in magnetic resonance spectroscopy (MRS), has become a widely accepted and commercially available technique for obtaining digitized visual images representing the internal structure of objects (such as the human body) having substantial populations of atomic nuclei that are susceptible to nuclear magnetic resonance (NMR) phenomena. In MRI nuclei in a body to be imaged are polarized by imposing a strong main magnetic field Ho on the nuclei. Selected nuclei are excited by imposing a radio frequency (RF) signal at a particular NMR frequency. By spatially distributing the localized magnetic fields, and then suitably analyzing the resulting RF responses from the nuclei, a map or image of relative NMR responses as a function of the location of the nuclei can be determined. Following a Fourier analysis, data representing the NMR responses in space can be displayed on a CRT.

As shown in FIG. 1, an NMR imaging system typically includes a magnet 10 to impose the static magnetic field, gradient coils 14 for imposing spatially distributed magnetic fields along three orthogonal coordinates, and RF coils 15 and 16 to transmit and receive RF signals to and from the selected nuclei. The NMR signal received by the coil 16 is transmitted to a computer 19 which processes the data into an image displayed on display 24. The magnetic resonance image is composed of picture elements called "pixels." The intensity of a pixel is proportional to the NMR signal intensity of the contents of a corresponding volume element or "voxel" of the object being imaged. The computer 19 also controls the operation of RF coils 15 and 16 and gradient coils 14 through the RF amplifier/detector 21 and 22 and gradient amplifiers 20, respectively.

Only nuclei with odd number of protons and/or neutrons have a magnetic moment and thus are susceptible to NMR phenomena. In MRI, a strong static magnetic field is employed to align nuclei, generating a gross magnetization vector aligned in parallel to the main magnetic field at equilibrium. A second magnetic field, applied transverse to the first field as a single RF pulse, pumps energy into the nuclei, which causes the gross magnetization vector to flip by, for example, 90°. In certain instances this RF pulse is also followed by a second stronger RF pulse to cause the gross magnetization vector to flip by another 180° (sometimes called a "flop"). After the excitation, the nuclei precess and gradually relax back into alignment with the static field. As the nuclei precess and relax, they will induce a weak but detectable electrical energy in the surrounding coils that is known as free induction decay (FID). These FID signals (and/or magnetic gradient-refocused field echoes thereof), collectively referred to herein as MR signals, are analyzed by a computer to produce images of the nuclei in space.

An operation whereby the various coils produces RF excitation pulses and gradient fields to result in and acquire an MR signal is called an acquisition pulse sequence. A graphical representation of a simple acquisition sequence is shown in FIG. 2. In this basic example, a gradient magnetic field, $T_{grad}$, is first superimposed along the main field to sensitize a slice of nuclei to a particular RF frequency. Thereafter, a specific slice of nuclei are selected by a 90° RF excitation pulse followed by a 180° RF pulse to generate a MR signal which, loosely speaking, appears as an "echo" following the 180° RF pulse. When the time between the 180° RF pulse center and the detected MR signal center is the same as that between the 90° RF pulse center and the 180° RF pulse center, the MR signal produced is conventionally called a symmetric "spin-echo" signal and the particular timing of applied pulses and fields shown in FIG. 2 is known as a spin-echo sequence. In addition, the MR echo-signal center can be shifted by adjusting applied field gradients so that an asymmetric spin-echo (ASE) is produced instead.

The NMR frequency and the main $B_0$ field are related by the Larmor relationship. This relationship, represented by the following equation, states that the angular frequency, $\omega_0$, of the precession of the nuclei is the product of the magnetic field, $B_0$, and the so-called gyromagnetic ratio, $\gamma$, a fundamental physical constant for each nuclear species:

$$\omega_0 = \gamma B_0$$

In magnetic resonance imaging (MRI) and volume-localized magnetic resonance spectroscopy (MRS), switching of magnetic field gradients is an essential part of almost every pulse sequence. It is a well known fact that such action induces eddy currents (EC) in surrounding conductive materials in magnets and creates undesirable EC field gradients and $B_0$ (main field) oscillations which ultimately cause image artifacts. Conventionally, some MRI and MRS systems employ a "pre-emphasis" network that is adjusted during a system alignment/calibration procedure in an attempt to minimize the effects of eddy-current induced gradient fields. Unfortunately, it is difficult to adjust the pre-emphasis network to effectively minimize the EC-induced gradient fields without having accurate measurements of the eddy-current induced fields.

Although, it is generally known that one can use small pick-up coils for directly measuring eddy currents, the use of pick-up coils for eddy current measurement typically requires additional hardware and special expertise in its use. For example, see "A Method for Mapping Magnetic Fields Generated by Current Coils", by J. Chankji, J. Lefevre and A. Briguet, J. Phys. E 18, 1014 (1985). Other somewhat less direct methods that rely on NMR measurement techniques to measure eddy currents-such as, for example, by measuring free induction decay (FID) signals of a small sample using small RF coils after switching off a field gradient pulse—are also known. See for example, "Gradient Time-Shape Measurement by NMR", by E. Yamamoto, H. Kohno, J. Phys. E 19, 708 (1986); "A Simple Method of Measuring Gradient Induced Eddy Currents to Set Compensation Networks", by R. E. Wysong and I. J. Lowe, Magn. Reson. Med. 29, 119–121 (1993); "Quantitative Characterization of the Eddy Current Fields in a 40-cm Bore Superconducting Magnet", by Q. Liu, D. G. Hughes, P. S. Allen, Magn. Reson. Med. 31, 73–76 (1994). Some NMR eddy current measurement methods even use a gross sample. See, for instance, "Temporal and Spatial Analysis of Fields Generated by Eddy Currents . . . ", by Ch. Boesch, R. Gruetter, and E. Martin, Magn. Reson. Med. 20, 268–284 (1991). Unfortunately, all of the above known methods are either very difficult to implement and/or lack the capability to distinguish between EC field gradients and $B_0$ (main field) oscillation—both of which are associated with eddy currents but have significantly different effects on image quality.

It would be extremely useful for MRI systems to have the capability of conveniently measuring the eddy currents induced by field gradient switching without requiring special equipment, either for trouble-shooting system performance problems or for assisting set-up of a pre-emphasis arrangement for minimizing the detrimental effects of the eddy currents. Consequently, there is a need for a method and system for obtaining distinct quantitative measurements of both EC-induced field gradients and $B_0$ oscillation in the presence of both large and small field inhomogeneities.

SUMMARY OF THE INVENTION

The present invention provides a method and apparatus for measuring and compensating the effects of eddy currents induced during NMR imaging operations. A cubic or cylindrical sample is placed in the imaging volume of a MRI system at a position centrally located with respect to the main magnetic field and oriented with its longitudinal axis parallel to a desired measuring direction. A magnetic field gradient pulse is applied for inducing eddy currents as well as for generation of a slice selective spin-echo signal. The spin-echo signal is acquired immediately after the termination of each eddy-current inducing gradient pulse. Two slices are selected along the desired measurement direction at equal symmetrical distances from the center of the main magnetic field. Two spin-echo signals are acquired for each slice with the eddy-current inducing gradient pulse reversed in polarity between the two echo signals. Quantitative values for eddy-current induced field gradients and $B_0$ oscillations are then determined based on the precessing frequencies of the acquired NMR signals.

Image quality is improved by compensating for eddy currents effects by applying the quantified values of the field gradients and $B_0$ oscillations to set an appropriate pre-emphasis network. In addition, gradient pulses in MRI/MRS acquisition sequences may be balanced to further account for gradient-induced eddy currents. Other aspects of the disclosed invention include measuring the time course of gradient switching, altering the signal acquisition sequences to measure eddy currents having long time constants, repeatedly measuring the eddy currents to assist in pre-emphasis adjustments, and measuring EC-induced field gradients and $B_0$ oscillation in the presence of moderately large background field (main $B_0$ field) inhomogeneities.

BRIEF DESCRIPTION OF THE DRAWINGS

The purpose and advantages gained by the present invention will be understood by careful study of the following detailed description of the presently preferred embodiment with particular reference to the accompanying drawings.

DETAILED DESCRIPTION OF THE PRESENTLY PREFERRED EMBODIMENT

Figure 1:
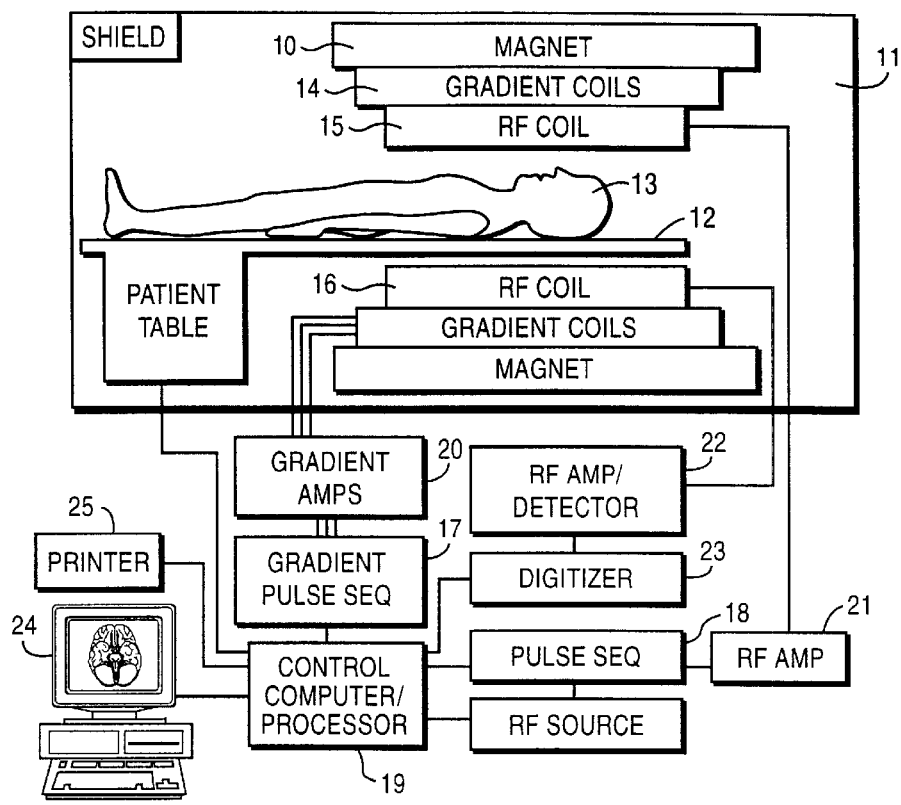
FIG. 1 is a schematic diagram of an MRI system.

FIG. 1 depicts an MRI system. One example of such a system is the Toshiba OPART™ MRI system. Such an MRI system may comprise a large polarizing magnet structure 10 which generates a substantially uniform homogeneous polarizing magnetic field $B_0$ within a patient imaging volume 11. A suitable carriage 12 inserts the desired portion of patient 13 anatomy within the image volume 11 Magnetic gradients are selectively created by electromagnetic gradient coils 14. RF nuclei nutation pulses are transmitted into the patient tissue within the image volume by RF coil 15. The RF responses constituting the MR signal are received from the patient tissue via suitable RF detection coil structures 16.

To acquire MRI data, the MRI system generates magnetic gradient and RF nutation pulses via MRI pulse sequence controllers 17 and 18 under the control of programmable computer/processor 19. In addition, processor 19 controls gradient pulse amplifier 20 and RF source and amplifier circuits 21 and 22. The MR signal (RF detector) circuits 22 are suitably interfaced with MR signal RF coils 16 located within the shielded MRI system gantry. The received MR responses are digitized by digitizer 23 and passed to processor 19 which may include an array processor or the like for image processing and suitable computer program storage media (not shown) wherein programs are stored and selectively utilized so as to control the acquisition and processing of MR signal data and to produce image displays on a CRT of control terminal 24. The MRI system is provided with a control terminal 24 which may include suitable keyboard switches and the like for exerting operator control over the imaging sequence controllers, 17 and 18. Images may also be recorded directly on film or on other suitable media by printing device 25.

In conjunction with system computer/processor 19, an operator is typically presented with a menu of choices for MRI sequences and data processing techniques. In the example embodiment of this invention, one of those choices available to the operator is a program for providing an MRI pulse sequence in accordance with the present invention for acquiring NMR signal data for measuring and analyzing eddy currents caused by the switching of field gradients within the MRI apparatus. The generation of a suitable detailed computer program for controlling an MRI apparatus and effecting the described method of the present invention is believed to be well within the ability of those skilled in the art in view of the totality of the disclosure herein.

Quantitation of EC Field Gradients and $B_0$ Oscillation

Figure 2:
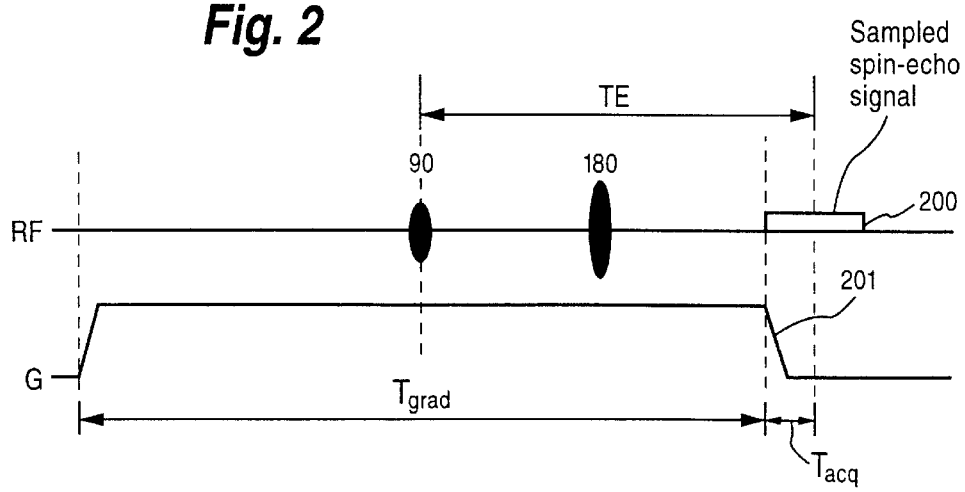
FIG. 2 illustrates RF and gradient waveform timing diagrams of an example spin-echo sequence in accordance with one embodiment of the present invention for quantitating eddy-current induced gradients and $B_0$ oscillations.
Figure 3A:
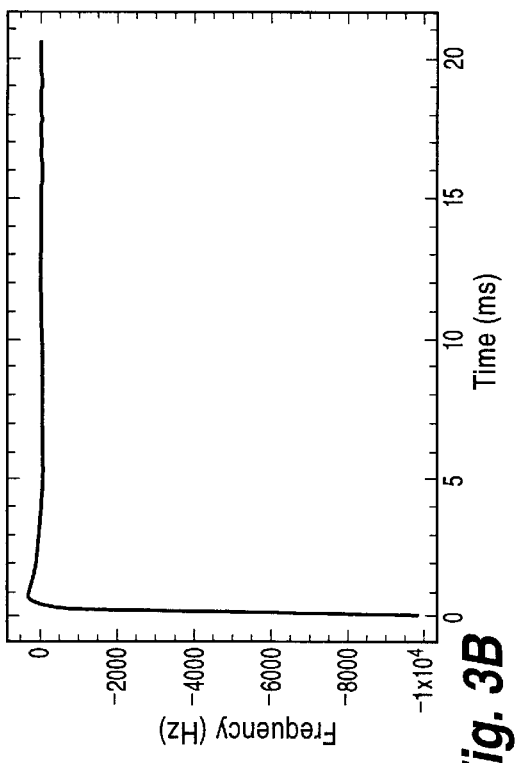
FIGS. 3A–3D are graphs illustrating the precessing frequencies of four NMR signals acquired with the pre-emphasis properly adjusted.
Figure 3B:
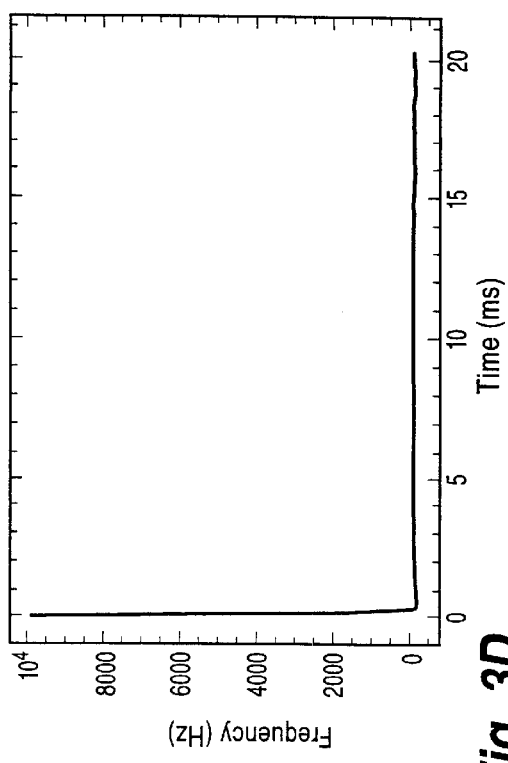
Figure 3C:
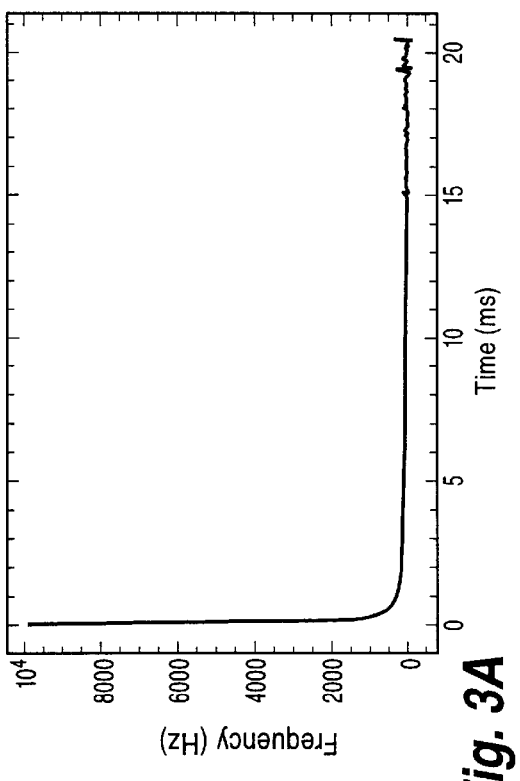
Figure 3D:
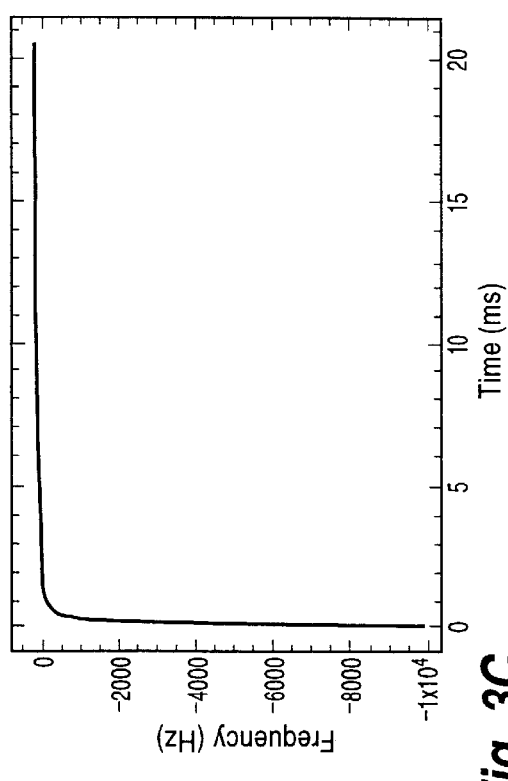
Figure 4A:
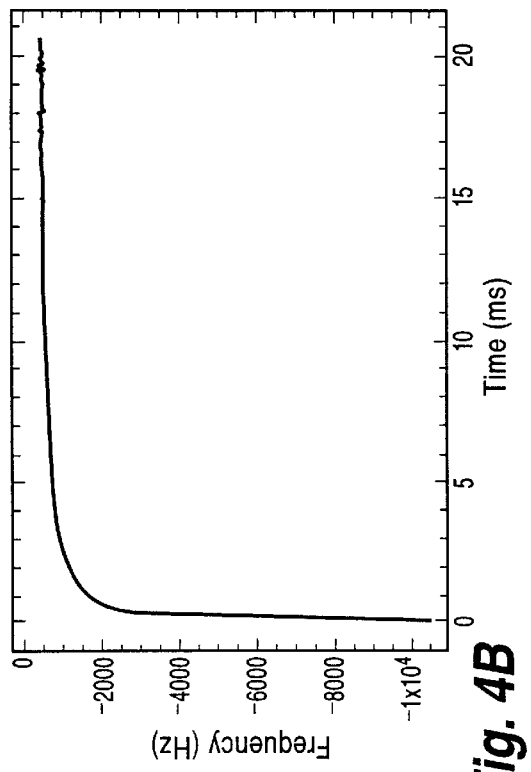
FIGS. 4A–4D are graphs illustrating the precessing frequencies of four NMR signals acquired with the pre-emphasis purposely mis-adjusted.
Figure 4B:
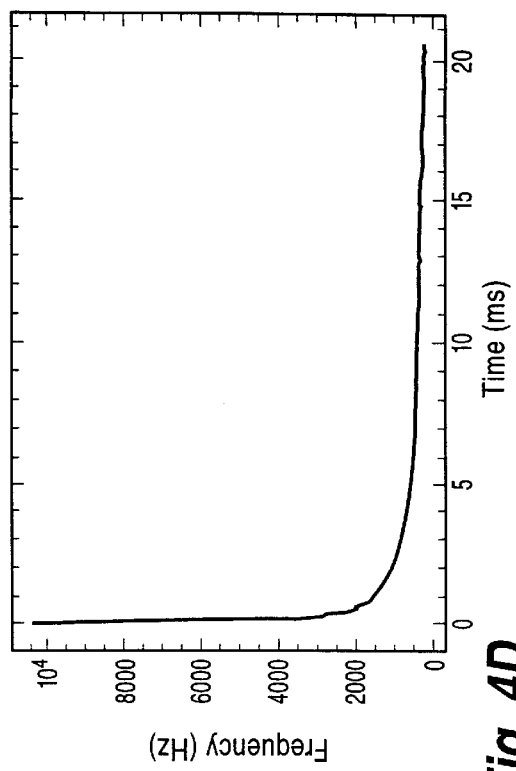
Figure 4C:
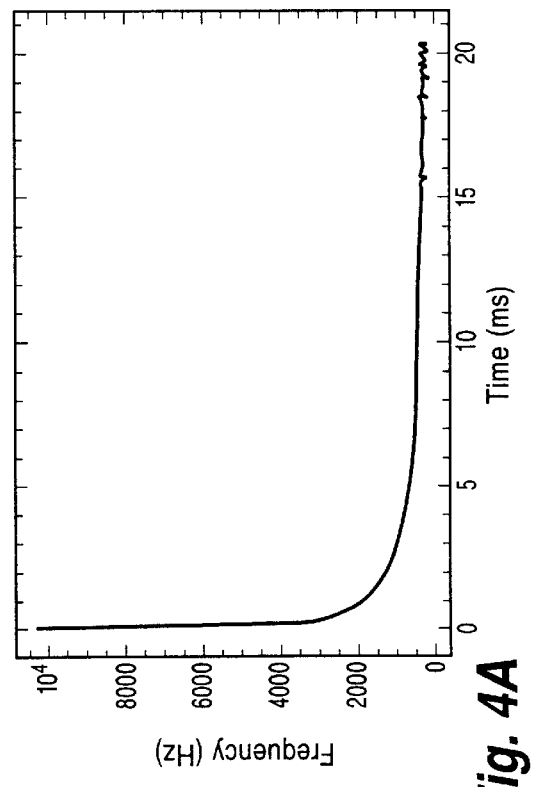
Figure 4D:
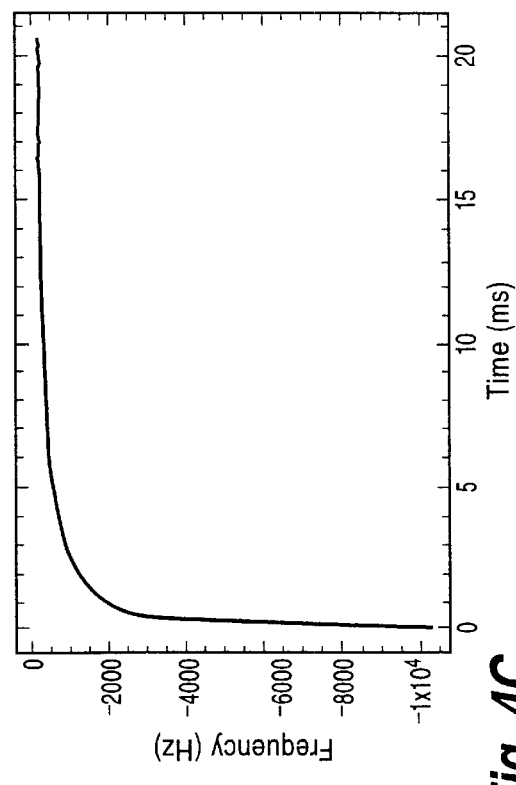

In a first example embodiment of the present invention, a simple spin-echo sequence having a slice selection gradient is used for measuring short time-constant (duration) eddy currents. In this example, the field gradient pulse used for slice selection is also the EC-inducing gradient pulse for which eddy currents are measured. Other embodiments may utilize a different EC-inducing gradient pulse. FIG. 2 depicts an example spin-echo sequence used to measure short time-constant eddy currents. Preferably, when measuring short time-constant eddy currents, spin-echo signals are sampled immediately after switching off an EC-inducing gradient pulse of duration $T_{grad}$ and are acquired over a period, $T_{acq}$, for which quantitation of EC field gradients and $B_0$ oscillation is desired.

In accordance with the present invention, an MR active test object (sample) having either cubic or elongated dimensions is positioned at the center of the main $B_0$ field with its longitudinal axis oriented along the measuring direction. Preferably, a total of four spin-echo signals are acquired from two slices symmetrically located at positions a distance $\Delta L$ away from the center of the main magnetic field, along the direction of the measurements. The polarity of the gradients are reversed between acquiring the first two spin-echo signals and acquiring the second two signals. The magnitude of the field gradients and separation/thickness of the two slices are adjustable via operator control or can be set to fixed appropriate values.

For the purpose of simplifying the following discussion of the example embodiments of the present invention, it is assumed that the primary effects of eddy currents generated by gradient switching are to induce an EC field gradient along the same direction of the inducing gradient pulse as well as to induce a certain amount of $B_0$ oscillation. It is further assumed that the polarities of the EC field gradient and $B_0$ oscillation reverse when the polarity of the eddy current inducing gradient pulse is reversed. While measurements according to the present invention can be made for any of the three physical dimensions of the sample space, the present discussion is limited to a case along a single X,Y,Z coordinate direction—for example, the "Z" direction of the main magnetic field. One skilled in the art will appreciate that any results thus obtained can readily be easily expanded to the remaining two spacial dimensions.

Accordingly, the four NMR signals acquired as described above can be expressed mathematically as follows:

$S_1(t) =$
$$\int\int \rho(X, Y, \Delta Z) e^{-i\gamma \Delta B(X,Y,\Delta Z)t} e^{-i\gamma \int_0^t \Delta B(t')dt'} e^{-i\gamma \int_0^t \Delta G(t')\Delta Z dt'} dXdY$$

$S_2(t) =$
$$\int\int \rho(X, Y, -\Delta Z) e^{-i\gamma \Delta B(X,Y,-\Delta Z)t} e^{-i\gamma \int_0^t \Delta B(t')dt'} e^{i\gamma \int_0^t \Delta G(t')\Delta Z dt'} dXdY$$

$S_3(t) = \int\int \rho(X, Y, \Delta Z) e^{-i\gamma \Delta B(X,Y,\Delta Z)t} e^{i\gamma \int_0^t \Delta B(t')dt'} e^{i\gamma \int_0^t \Delta G(t')\Delta Z dt'} dXdY$ $S_4(t) =$ -continued
$$\int\int \rho(X, Y, -\Delta Z) e^{-i\gamma \Delta B(X,Y,-\Delta Z)t} e^{i\gamma \int_0^t \Delta B(t')dt'} e^{-i\gamma \int_0^t \Delta G(t')\Delta Z dt'} dXdY$$

where $S_n(t)$ is the acquired MR signal; $\Delta Z$ is offset of the slices from the center of magnet; $\rho(X,Y,\Delta Z)$ and $\rho(X,Y,-\Delta Z)$ are spin distribution in slices $\Delta Z$ and $-\Delta Z$, respectively; $\Delta B(X,Y,\Delta Z)$ and $\Delta B(X,Y,-\Delta Z)$ are background field inhomogeneities in slices $\Delta Z$ and $-\Delta Z$, respectively; $\Delta B(t')$ is the time-varying EC induced $B_0$ oscillation; and $\Delta G(t')$ is the time-varying EC field gradient.

By letting:

$$\int\int \rho(X,Y,\Delta Z) e^{-i\gamma \Delta B(X,Y,\Delta Z)t} dXdY = A^+(t) e^{-i\phi+(t)}$$

and $$\int\int \rho(X,Y,-\Delta Z) e^{-i\gamma \Delta B(X,Y,-\Delta Z)t} dXdY = A^-(t) e^{-i\phi-(t)},$$

one skilled in the art will appreciate that the time-varying spin precession frequencies of the four spin-echo signals are related to the time-varying EC induced field gradient and $B_0$ oscillation by the following four equations:

$$f_1(t) = \frac{d\phi+(t)}{dt} + \gamma \Delta B(t) + \gamma \Delta G(t)\Delta Z$$

$$f_2(t) = \frac{d\phi-(t)}{dt} + \gamma \Delta B(t) - \gamma \Delta G(t)\Delta Z$$

$$f_3(t) = \frac{d\phi+(t)}{dt} - \gamma \Delta B(t) - \gamma \Delta G(t)\Delta Z$$

$$f_4(t) = \frac{d\phi-(t)}{dt} - \gamma \Delta B(t) + \gamma \Delta G(t)\Delta Z$$

where $f_n(t)$ is the time-varying precessing frequency of a spin-echo signal; $\Delta G(t)$ and $\Delta B(t)$ are, respectively, the field gradient and $B_0$ oscillation produced by the induced eddy currents; $\gamma$ is the gyromagnetic ratio; and $\phi$ is the phase angle induced by field inhomogeneities within the selected slice.

Therefore, the time-varying EC field gradient, $\Delta G(t)$, and $B_0$ oscillation, $\Delta B(t)$, can be quantitated according to the following two equations:

$$\gamma \Delta G(t) = \frac{f_1(t) - f_2(t) - f_3(t) + f_4(t)}{4\Delta Z} \quad \text{EQU. 1}$$

$$\gamma \Delta B(t) = \frac{f_1(t) + f_2(t) - f_3(t) - f_4(t)}{4} \quad \text{EQU. 2}$$

Moreover, the above time-varying "precessing frequencies" can be quantitatively obtained from the four NMR signals according to the following relationship:

$$f_n(i) = \frac{u(i)\dot{v}(i) - v(i)\dot{u}(i)}{u^2(i) + v^2(i)}$$

with $$u(i) = \frac{S_n^u(i+1) + S_n^u(i)}{2}$$

$$v(i) = \frac{S_n^v(i+1) + S_n^v(i)}{2}$$

$$\dot{u}(i) = \frac{S_n^u(i+1) - S_n^u(i)}{\Delta t}$$

$$\dot{v}(i) = \frac{S_n^v(i+1) - S_n^v(i)}{\Delta t}$$

where $f_n(i)$ for n=1, 2, 3, 4 represents precessing frequencies of the four NMR signals corresponding to the first and second pair of spin-echo signals; i for i=0,1, 2, ... N−2 represents a particular data sample with N being a predetermined number of data samples acquired from a spin-echo NMR signal; $s_n''$ and $s_n'$ are real and imaginary parts of complex NMR signal data acquired; $\dot{u}(i)$ and $\dot{v}(i)$ are corresponding time derivatives of u(i) and v(i), respectively; and Δt is the "tick" or sampling rate (in seconds) of acquired NMR signal data.

Consequently, quantitative values for the EC field gradient and $B_0$ oscillation are determined from the quantitative values obtained for the four precessing frequencies using EQU 1 and EQU 2, respectively.

As a quantitative example, FIGS. 3 and 4 show the precessing frequencies of four NMR signals acquired in accordance with the method of the present invention. In this example, a 10-cm cubic-shaped sample consisting of ordinary commercial "baby-oil" is used as a MR active test object to obtain EC measurements in accordance with the method of the present invention as described above. A slice thickness of 2 mm is used and the slices are obtained at a distance of 4 cm from the center of the main magnet (i.e., the main $B_0$ field), thus providing a separation of 8 cm between the two slices. A gradient pulse, $T_{grad}$, having an amplitude of 0.95 Gauss/cm and a duration of 100 ms is used. The four spin-echo signals are acquired using 512 complex sampling points over an acquisition period of 20.48 ms. Four averages are then acquired with a sequence repetition time (period) TR=0.5 seconds and a signal echo time TE=56 ms, thus, resulting in a total acquisition time of 4 seconds for a full set of data. A first set of four data signals is acquired using an MRI system having an adjusted pre-emphasis network. A second set of four data signals is acquired using the same system with the pre-emphasis network "mis-adjusted".

The pre-emphasis network utilizes three time constants for each physical channel that are adjusted during an MRI system alignment so as to minimize eddy-current induced gradient fields. A "mis-adjustment" is achieved simply by switching off the pre-emphasis network. Accordingly, FIGS. 3A–3D show the precessing frequencies of the four NMR signals acquired with a pre-emphasis network previously adjusted and FIGS. 4A–4D show the corresponding signal data acquired with the pre-emphasis purposely mis-adjusted.

Figure 5A:
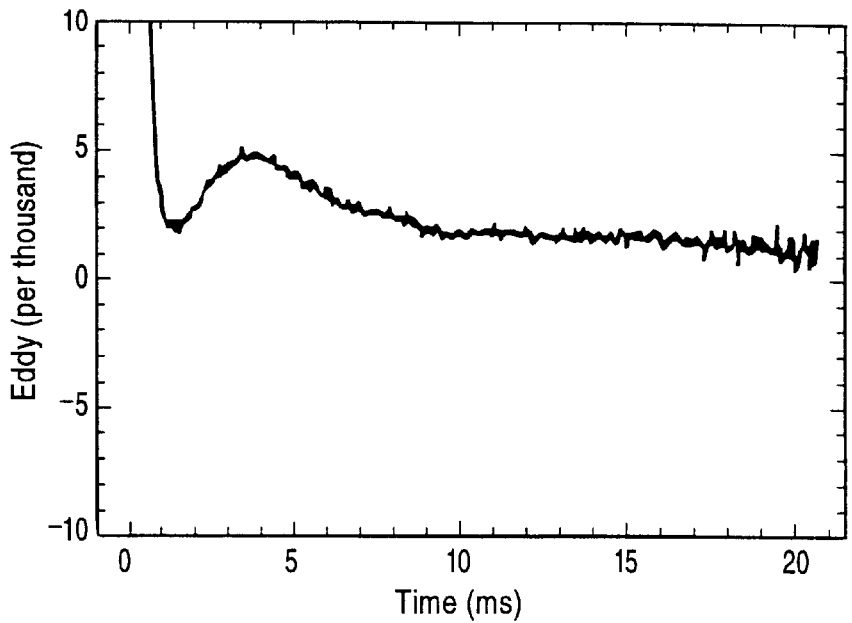
FIG. 5A is a graph of the time course of the EC field gradient determined from the data shown in FIGS. 3A–3D.
Figure 5B:
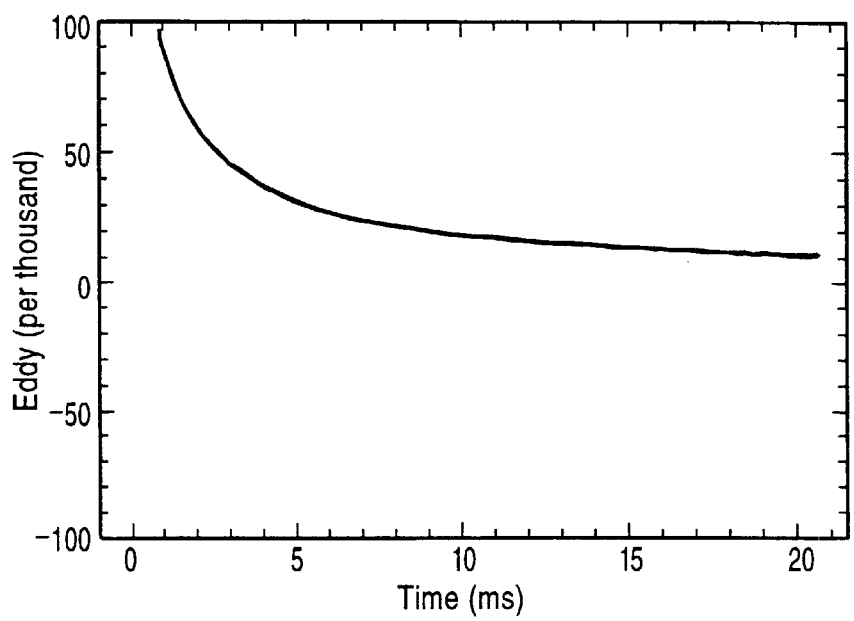
FIG. 5B is a graph of the time course of the EC field gradient determined from the data shown in FIGS. 4A–4D.

FIGS. 5A and 5B illustrate the time courses of the EC field gradient determined using EQU 1 and the precessing frequency data shown in FIGS. 3A–3D and FIGS. 4A–4D. Accordingly, FIG. 5A illustrates the time course of the EC field gradient with the pre-emphasis properly adjusted and FIG. 5B illustrates the time course of the EC field gradient with the pre-emphasis turned off. In FIGS. 5A and 5B, the EC field gradient is expressed as per thousand of the inducing gradient magnitude.

Characterization Of Gradient Transition During Switching

In accordance with another embodiment of the present invention, the above described method for quantitating EC gradients, is also used to characterize the time course during gradient switching (i.e., a rapid change in the magnitude of the gradient) in a NMR imaging apparatus. A gradient strength vs. time characterization graph of the time course of gradient switching, as produced in accordance with the present invention, can prove useful for evaluating the functioning of MRI hardware as well as for automatic balancing of gradient pulses in MRI/MRS pulse sequences. The field vs. time characterization data is obtained by using a spin-echo signal sequence as described above and initiating a sampling of spin-echo signal data just before or immediately after the gradient field is switched and continuing the sampling throughout the entire transition period of the gradient switching, as illustrated in FIG. 2 by spin-echo signal 200 sampling duration $T_{acq}$ and falling edge 201 of gradient pulse $T_{grad}$.

Figure 6A:
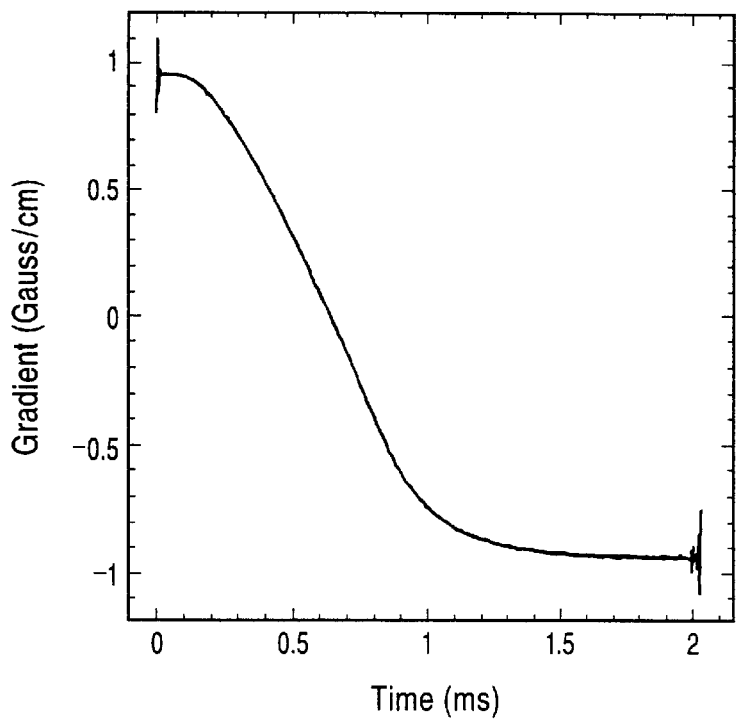
FIGS. 6A and 6B are graphs of the time course of a gradient switching in an MRI system measured in accordance with the present invention.
Figure 6B:
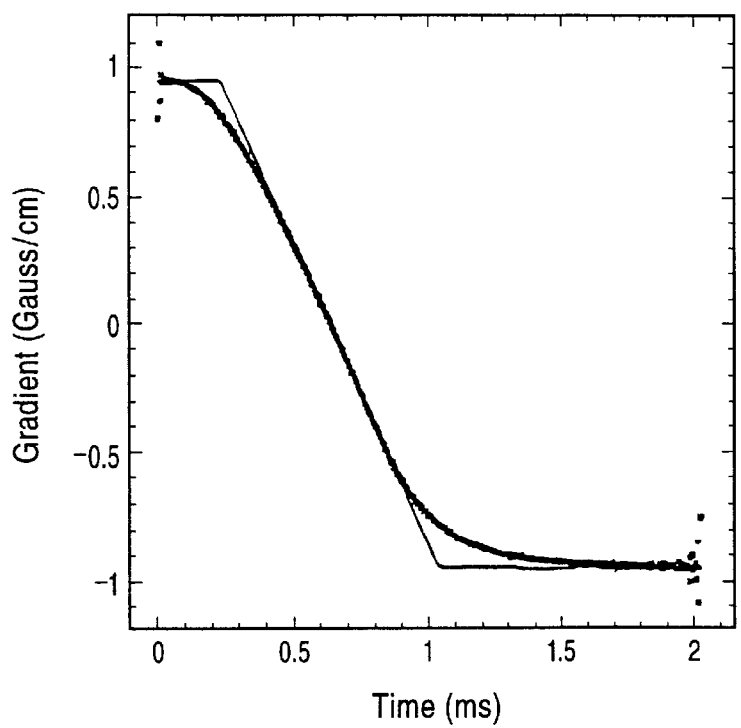

FIGS. 6A and 6B show an example of a time course graph of gradient switching in an NMR imaging apparatus acquired using the method of the present invention. In this example, a magnetic field gradient in an x-coordinate direction (i.e., perpendicular to the conventional z-coordinate direction of the main field) is "switched" from 0.95 Gauss/cm to −0.95 Gauss/cm. The time course of the gradient transition, as shown in FIG. 6A, is obtained by sampling the MR spin-echo signal over a 2.048 ms period beginning immediately after the gradient field is switched. If desired, the time course data from the gradient switching measurement may be "fit" to a somewhat more convenient gradient switching "model". For example, one convenient model is one that is characterized simply in terms of a delay time and a slew rate. In accordance with such a model, gradient switching is described in terms of a constant value field magnitude that persists for an short period followed by a linear change in magnitude at a constant slew rate to the final field magnitude of the transition, as illustrated by the solid line in FIG. 6B.

Figure 7:
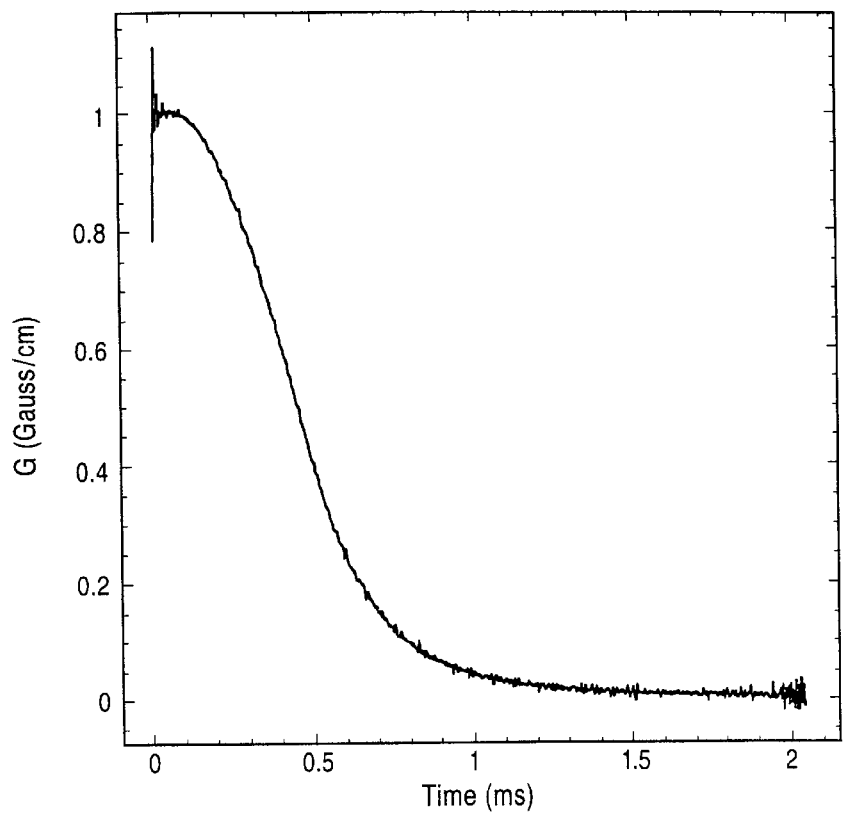
FIG. 7 is graph of the time course of a second example gradient switching in an MRI system measured in accordance with the present invention.

FIG. 7 shows a second example of a time course graph of gradient switching in an MRI apparatus measured using the method of the present invention. In this example, a spin-echo sequence having a signal echo time, TE, of 20 ms is used with a 125 ms long magnetic field gradient pulse, $T_{grad}$, "switched" from 1 Gauss/cm to zero Gauss/cm. The MR signal data is acquired during the gradient transition using 512 data sampling points at a sampling rate of 4 μs per sample.

Measurement Of Eddy Currents Having Long Time Constants

Figure 8:
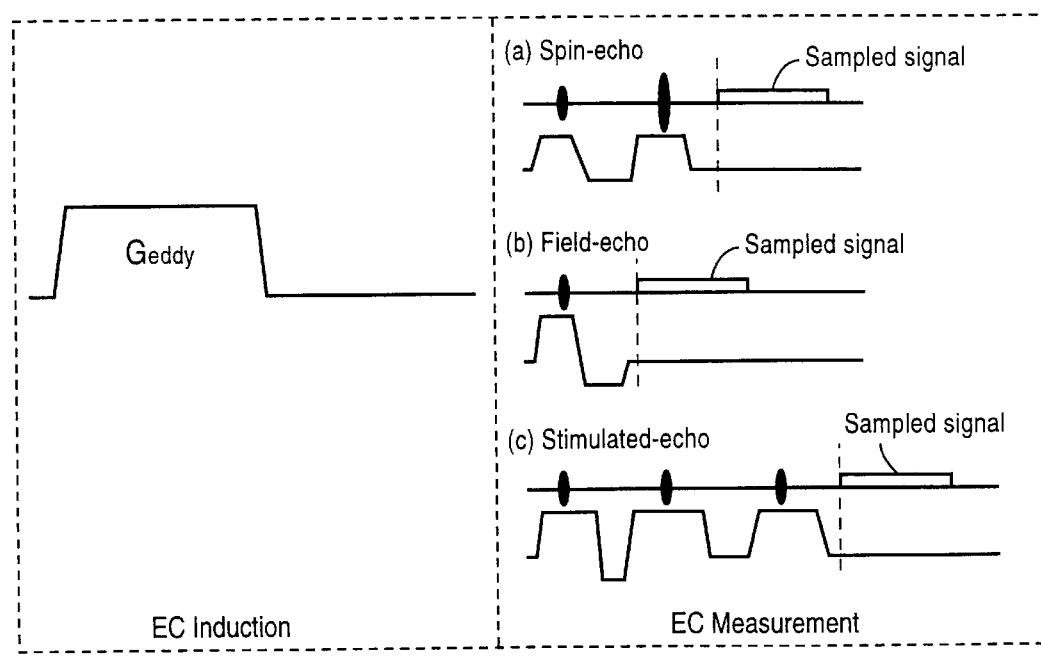
FIG. 8 is a schematic diagram illustrating alternative MRI pulse sequences for measuring eddy currents having long time constants.

Since the window of time for obtaining measurements after the occurrence of a gradient switching is limited by what is known as the "T2" or "apparent spin-spin relaxation time" of the sample, the spin-echo sequence of FIG. 2 is not useful for measuring eddy currents having a long time-constant. Consequently, in accordance with another embodiment of the present invention, eddy currents having a long time-constant are measured using a different set of NMR pulse sequences, such as those shown in FIG. 8. Unlike the particular spin-echo sequence used for evaluating short time-constant eddy currents as shown in FIG. 2, the type of pulse sequences preferred for measuring long time-constant eddy currents must produce NMR signals that are generated after the termination of the gradient pulse transition period that occurs when switching off an EC-inducing gradient pulse, as illustrated by the three examples shown in FIG. 8. An NMR signal data sample acquisition "window" can then be flexibly arranged to occur a predetermined time after termination of the EC gradient pulse to cover the longer signal data acquisition period required for measuring a long time-constant eddy current. Although FIG. 8 illustrates at (a), (b) and (c), respectively, a spin-echo, a field-echo and a stimulated-echo signal acquisition pulse sequence as selected examples, other slice selective acquisition schemes may also be utilized for measuring eddy currents that have a long time-constant.

NMR signal data is obtained by using the above described two-slice four-signal sampling procedure and quantitative values for the EC field gradient, ΔG(t), and $B_0$ oscillation, ΔB(t), are determined using EQU 1 and EQU 2. If necessary, the selected pulse sequence may be repeated many times after gradient switching to achieve quantitation through multiple sampling windows. Since the slice-selection gradients remain the same while the EC gradient is reversed in polarity between the two echo signals of each slice, any eddy currents induced by the slice selection gradient pulses are eliminated from the EC field gradient, $\Delta G(t)$, and $B_0$ oscillation, $\Delta B(t)$, as quantitated using EQU. 1 and EQU. 2.

Figure 9A:
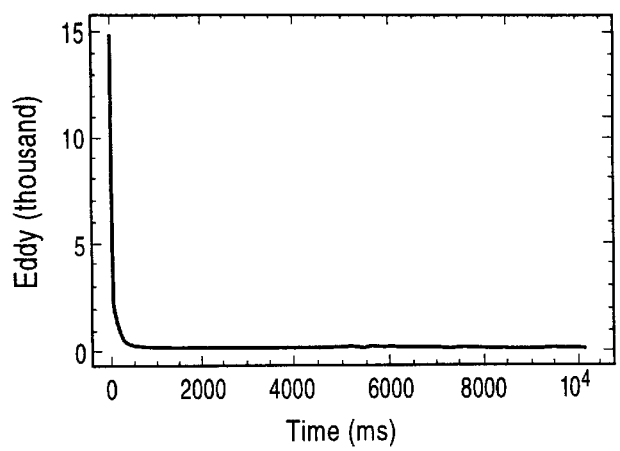
FIGS. 9A and 9B are time course graphs of an example EC gradient having a long time constant measured in accordance with another example embodiment of the present invention.
Figure 9B:
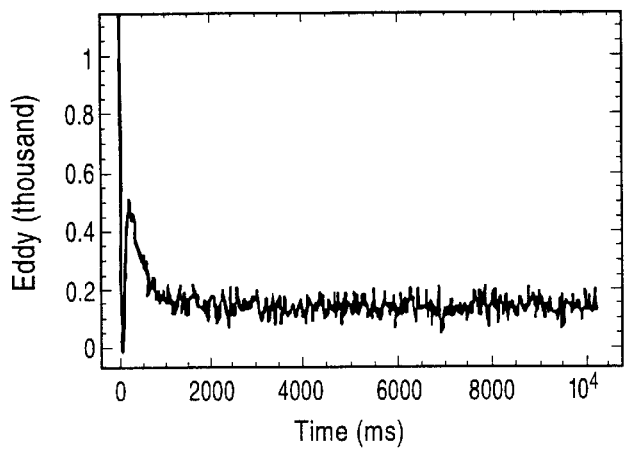

FIGS. 9A and 9B are time course graphs of an example EC gradient having a long time constant measured using a field-echo pulse sequence in accordance with the present invention. FIG. 9A shows an EC gradient created with pre-emphasis off and FIG. 9B shows an EC gradient created with pre-emphasis on and properly adjusted. In this example, a series of 512 slice selective field-echo signals are acquired after a 1 second long gradient pulse of 0.75 Gauss/cm. A field-echo signal is acquired every 20 ms with 32 data points at a sampling pitch of 40 $\mu$s. Thus, for this example, the data acquisition time window for measurement of the long time constant EC gradient covers 10.24 seconds with a time resolution of 20 ms. The 32 data points of each signal are used to obtain precessing frequencies for each signal. The precessing frequencies are then averaged to a single frequency representing each acquired signal and the EC gradient and $B_0$ oscillation are then determined from the averaged precessing frequency from the four slice-selective measurements as described above.

Repeated Measurements and Display of Eddy Currents for Pre-Emphasis Adjustments

Measurements of eddy currents according to the above described method of the present invention may be repeatedly performed and the time courses of measured EC gradient and $B_0$ oscillation displayed to evaluate a particular MRI system response to adjustments of a pre-emphasis network associated with the MRI system. For example, using a pulse sequence repetition period (TR) of 0.2s without signal averaging, a time resolution of 0.4s can be achieved using the above described short time-constant EC measurement method by acquiring two slices in a single TR period. Since EC gradient and $B_0$ oscillation are separately quantitated, adjustments of the $B_0$ and gradient components of the pre-emphasis network may be made and monitored separately.

Quantitation and Compensation of Large Background Field Inhomogeneities

Assuming that the inhomogeneous background magnetic field contains dominantly large static linear gradients, which may be represented mathematically by the following relationship:

$$\Delta B(X,Y,Z) \approx \bar{G}_X X + \bar{G}_Y Y + \bar{G}_Z Z$$

then, the above described four-signal two-slice method of the present invention for measuring eddy currents and determining EC gradient and $B_0$ oscillation can also be used to estimate the background static gradients for the Z direction, for example, according to the following equation:

$$\bar{G}_Z = \frac{f_1 - f_2 + f_3 - f_4}{4\Delta Z} \quad \text{EQU. 3}$$

The preceding described embodiments of the present invention for measuring eddy currents rely on acquisitions of slice-selected echo-signals obtained primarily in the absence of other field gradients. When there are large background field gradients or background field inhomogeneities present, particularly in a direction perpendicular to the measuring direction, the acquired signal amplitude will oscillate and will introduce errors into the EC measurements. Therefore, in accordance with another embodiment of the present invention, such errors are corrected by first determining the static background gradients, and then compensating by using small field gradients of equal magnitudes but opposing the static gradients along the corresponding directions.

Figure 10:
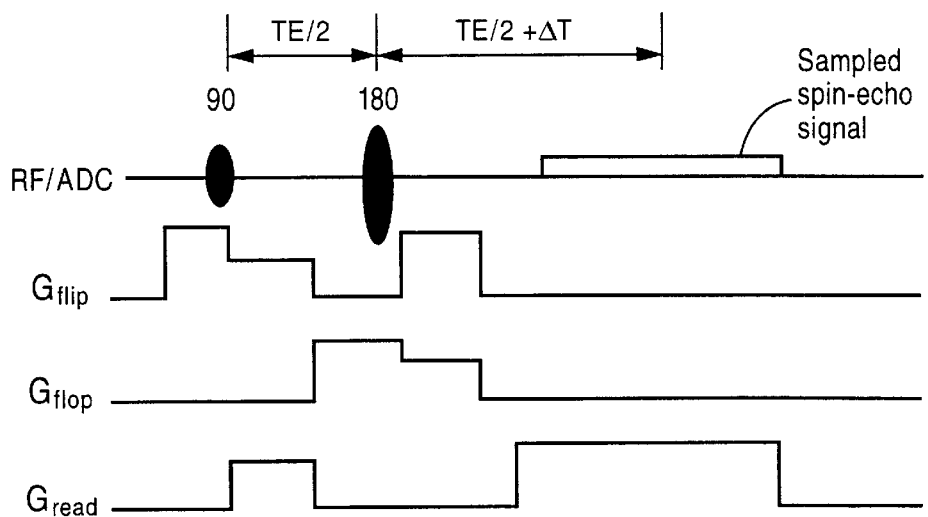
FIG. 10 is diagram of an example line-selective asymmetric spin-echo (ASE) sequence for measuring a static background field gradient in accordance with a further embodiment of the present invention.

FIG. 10 shows an example pulse sequence used for quantitating large linear background gradients according to this further embodiment of the present invention. The sequence shown in FIG. 10 is basically a line-selective asymmetric spin-echo (ASE) sequence with line-selection along directions orthogonal to the measuring direction. The echo signal is acquired with a frequency-encoding readout gradient oriented along the measuring direction. The signals are measured twice: once with the readout gradient in a first (positive) direction and a second time with the readout gradient oriented in the opposite (negative) direction.

A one-dimensional (1D) Fourier transformation of the acquired MR signals may be mathematically described as follows:

$$S^+(Z) = \rho(Z) e^{-i\gamma \bar{G}^Z Z \Delta T} e^{-i\phi^0(Z)}$$

$$S^-(Z) = \rho(Z) e^{-i\gamma \bar{G}^Z Z \Delta T} e^{i\phi^0(Z)}$$

where $\rho(Z)$ is spin distribution of the selected line; $\bar{G}_Z$ is static background field gradient along a measuring or readout direction (in this case designated as the "Z" axis); and $\phi_0(Z)$ is phase error attributed to a mis-tuning of the readout gradient.

Accordingly, signal phases are described as a function of spatial position along the readout line as follows:

$$\phi^+(Z) = \gamma \bar{G}_Z Z \Delta T + \phi_o(Z)$$

$$\phi^-(Z) = \gamma \bar{G}_Z Z \Delta T - \phi_o(Z)$$

Thus the background field gradients are determined from the above signal phases according to the following relationship:

$$\bar{G}_Z = \frac{\dot{\phi}^+ + \dot{\phi}^-}{2\Delta T} \quad \text{EQU. 4}$$

where $\dot{\phi}^+$ and $\dot{\phi}^-$ are spatial derivatives of the signal phase along the selected line; and $\Delta T$ is the time shift of the ASE signal from the spin-echo position.

Figure 11A:
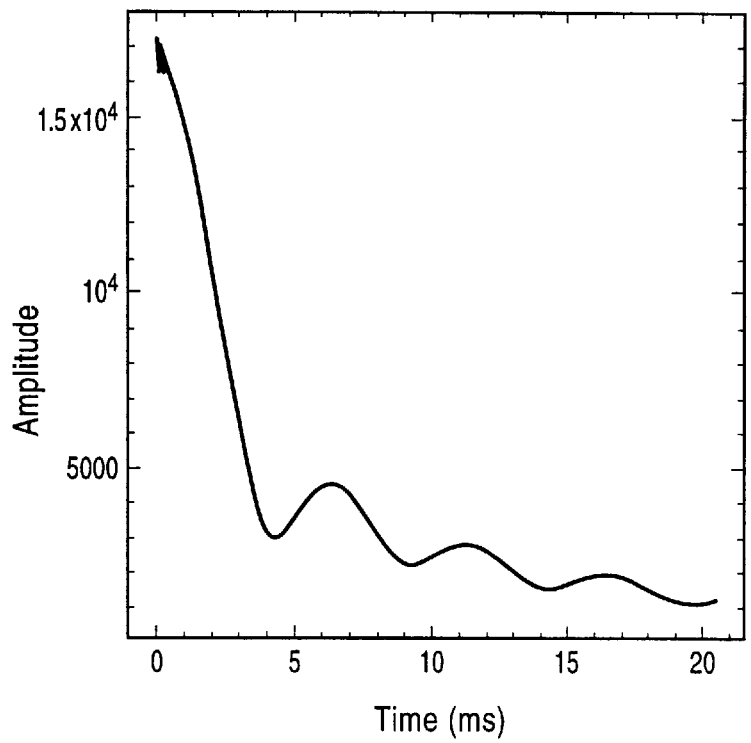
FIGS. 11A, 11B, 11C and 11D are graphs of the amplitude and phase of spin-echo signals.
Figure 11B:
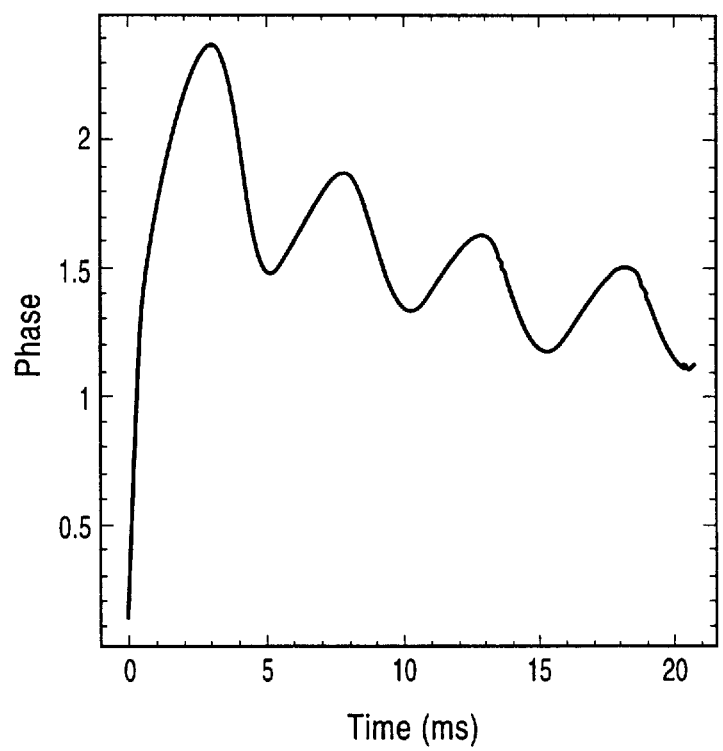
Figure 11C:
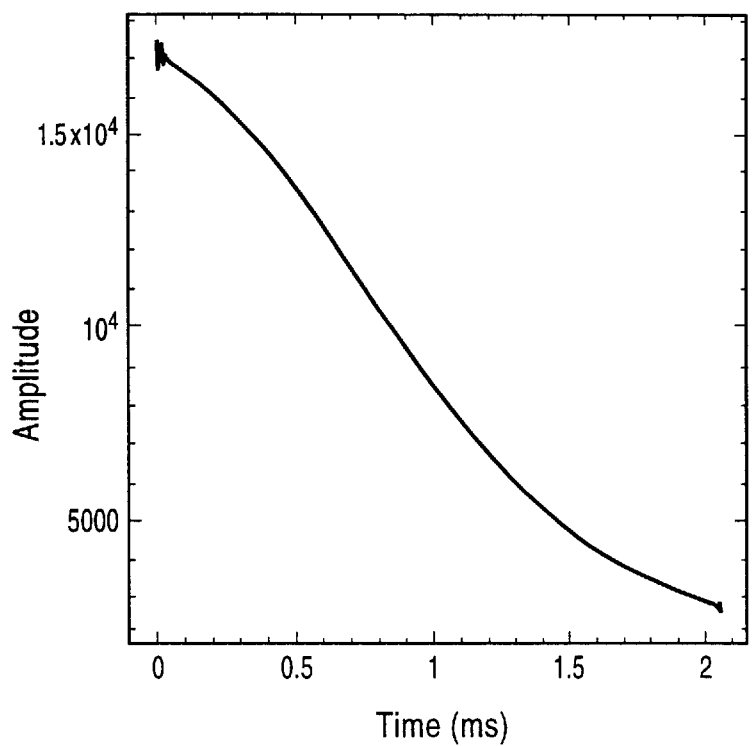
Figure 11D:
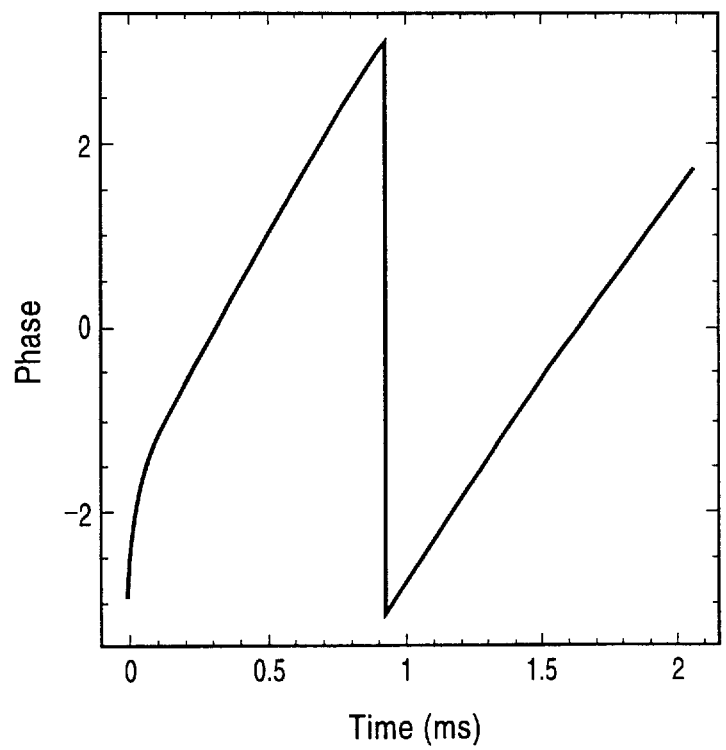
Figure 12A:
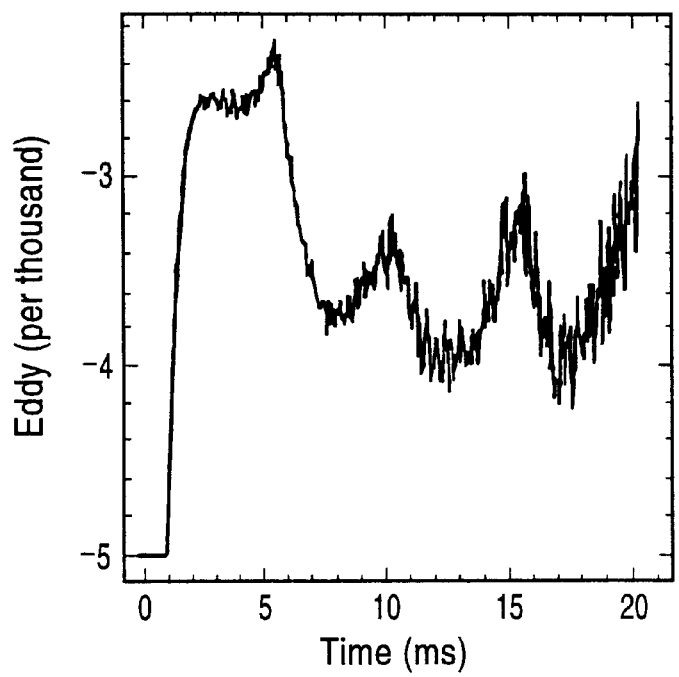
FIGS. 12A and 12B are graphs of the time course of eddy currents.
Figure 12B:
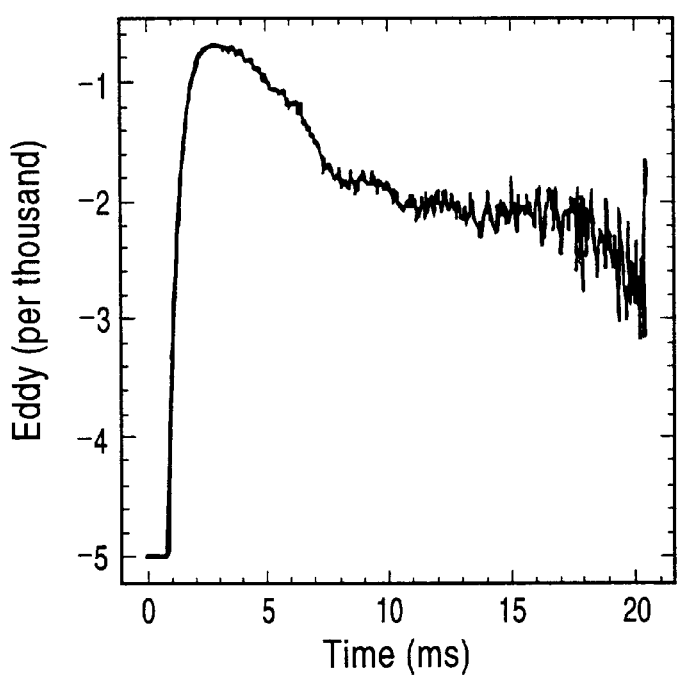

The effects of the background field gradients are then compensated in any imaging sequence by adding gradients having the same magnitudes but with opposite polarity as that of the background field gradients. Such opposing gradients are applied on top of imaging gradients for any time periods of the acquisition sequence where compensation of static field gradients are needed. FIGS. 11A–11D show spin-echo signals acquired using the sequence previously described above for measuring short time-constant eddy currents. FIGS. 11A and 11B show NMR signals acquired without compensation of static gradients—which, in this example, consist mainly of a 1.2 ppm/cm static gradient along the "Y" coordinate direction. FIGS. 11C and 11D show NMR signals acquired with compensation of the same static gradient. FIGS. 12A and 12B show the time course of the eddy current quantitated in accordance with the present invention from the data of FIGS. 11B and 11D, respectively.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method for evaluating eddy currents induced during gradient switching in an MRI system having a static magnetic field, $B_0$, and gradient coils to induce gradients in the static field, the method comprising the steps of:

a) placing an MR active test object at a center of an imaging volume of the MRI system and aligning the object along a predetermined direction for measurement of eddy currents;

b) applying a first gradient pulse to a gradient coil to produce a switching gradient in the magnetic field $B_0$ and acquiring signal data samples from a first pair of spin-echo NMR signals corresponding to two MRI slices located symmetrically apart along said measurement direction away from a center of the magnetic field $B_0$;

c) applying a second gradient pulse to the gradient coil, the second gradient pulse having a polarity opposite to the first gradient pulse, and acquiring signal data samples from a second pair of spin-echo NMR signals corresponding to the slices of step (b);

d) determining precessing frequencies from acquired signal data samples for each spin-echo signal of the first and second pair of spin-echo NMR signals; and e) quantifying field gradients and/or field oscillations produced due to eddy currents from the precessing frequencies determined in step (d).

2. A method as in claim 1 wherein quantitative values for precessing frequencies of spin-echo signals are determined from acquired NMR signal data samples according to the following relationships:

$$f_n(i) = \frac{u(i)\dot{v}(i) - v(i)\dot{u}(i)}{u^2(i) + v^2(i)}$$

with $$u(i) = \frac{S_n^u(i+1) + S_n^u(i)}{2}$$

$$v(i) = \frac{S_n^v(i+1) + S_n^v(i)}{2}$$

$$\dot{u}(i) = \frac{S_n^u(i+1) - S_n^u(i)}{\Delta t}$$

$$\dot{v}(i) = \frac{S_n^v(i+1) - S_n^v(i)}{\Delta t}$$

where $f_n(i)$ for n=1, 2, 3, 4 represents precessing frequencies of four NMR signals corresponding to said first and second pair of spin-echo signals; i for i=0,1, 2, . . . N−2 represents a particular data sample with N being a predetermined number of data samples acquired from a spin-echo NMR signal; $s_n^u$ and $s_n^v$ are real and imaginary parts of complex NMR signal data acquired; $\dot{u}(i)$ and $\dot{v}(i)$ are corresponding time derivatives of $u(i)$ and $v(i)$, respectively; $\Delta t$ is a sampling rate of acquired NMR signal data; and wherein quantitative values for a time-varying field gradient and a time-varying $B_0$ oscillation are determined according to the following relationships:

$$\gamma \Delta G(t) = \frac{f_1(t) - f_2(t) - f_3(t) + f_4(t)}{4\Delta Z}$$

$$\gamma \Delta B(t) = \frac{f_1(t) + f_2(t) - f_3(t) - f_4(t)}{4}$$

where $f_n(t)$ represents a time-varying precessing frequency of a spin-echo signal; $\Delta G(t)$ and $\Delta B(t)$ are, respectively, the time-varying field gradient and time-varying $B_0$ oscillation produced by eddy currents; and $\gamma$ is a gyromagnetic ratio value of an appropriate nuclear species.

3. A method as in claim 1 wherein an applied field gradient used for slice selection also serves as an eddy current inducing gradient pulse for which eddy currents are evaluated and said slice-selected spin-echo NMR signals are generated by applying a selective 90° RF pulse followed by another selective 180° pulse during the application of said field gradient.

4. A method as in claim 3 for evaluating short time-constant eddy currents wherein said spin-echo NMR signals are acquired immediately after switching of said gradient pulse and are acquired during a predetermined period of time for which quantitation of EC-induced field gradient and $B_0$ oscillation is desired.

5. A method as in claim 3 for characterizing a gradient switching time course wherein acquisitions of said spin-echo signals are started before said gradient pulse is switched to a different target value and are continued to cover the entire transition period of the gradient switching, and wherein said spin-echo signals are used to characterize the time course of the gradient switching.

6. A method as in claim 1 for evaluating long time-constant eddy currents wherein an MRI pulse sequence is used which produces NMR signals that are generated after termination of said gradient pulse and NMR signal data samples are repeatedly acquired for a predetermined period of time for which quantitation of eddy currents is desired.

7. A method as in claim 6 wherein said MRI sequence is a slice selective field-echo sequence.

8. A method as in claim 6 wherein said MRI reference is a slice selective spin-echo sequence.

9. A method as in claim 6 wherein said MRI sequence is a slice selective stimulated-echo sequence.

10. A method as in claim 1 wherein MRI system response to adjustments of a pre-emphasis network associated with the MRI system are evaluated, further comprising the steps of:

(i) producing time-varying EC-induced field gradient and $B_0$ oscillation, $\Delta G(t)$ and $\Delta B(t)$, respectively, after switching off said EC-inducing gradient pulse;

(ii) changing the pre-emphasis network settings;

(iii) repeating steps (i) and (ii) a predetermined number of times; and comparing time course graphs of EC gradients $B_0$ oscillation generated in step (i) to evaluate MRI system response to changes in pre-emphasis network settings.

11. A MRI system for evaluating eddy currents induced during magnetic gradient switching wherein an MR active test object is positioned at a center of an imaging volume of the MRI system and aligned along the measurement direction, the MRI system having a static magnetic field, $B_0$, and gradient coils to induce gradients in the static field, comprising:

means for applying a first gradient pulse to a gradient coil and acquiring a first pair of spin-echo signal samples corresponding to two slices located symmetrically apart along said measurement direction away from a center of the magnetic field $B_0$; and means for applying a second gradient pulse to the gradient coil, the second gradient pulse having a polarity opposite to the first gradient pulse, and acquiring a second pair of spin-echo signal samples corresponding to said two slices; and means for quantitatively determining magnetic field gradients and/or magnetic field oscillations due to eddy currents according to precessing frequencies of acquired spin-echo signals.

12. A MRI system as in claim 11 wherein quantitative values for precessing frequencies of spin-echo signals are determined from acquired NMR signal data samples according to the following relationships:

$$f_n(i) = \frac{u(i)\dot{v}(i) - v(i)\dot{u}(i)}{u^2(i) + v^2(i)}$$

with $$u(i) = \frac{S_n^u(i+1) + S_n^u(i)}{2}$$

$$v(i) = \frac{S_n^v(i+1) + S_n^v(i)}{2}$$

$$\dot{u}(i) = \frac{S_n^u(i+1) - S_n^u(i)}{\Delta t}$$

$$\dot{v}(i) = \frac{S_n^v(i+1) - S_n^v(i)}{\Delta t}$$

where $f_n(i)$ for n=1, 2, 3, 4 represents precessing frequencies of four NMR signals corresponding to said first and second pair of spin-echo signals; i for i=0,1, 2, . . . N−2 represents a particular data sample with N being a predetermined number of data samples acquired from a spin-echo NMR signal; $s_n^u$ and $s_n^v$ are real and imaginary parts of complex NMR signal data acquired; $\dot{u}(i)$ and $\dot{v}(i)$ are corresponding time derivatives of u(i) and v(i), respectively; $\Delta t$ is a sampling rate of acquired NMR signal data; and wherein quantitative values for a time-varying field gradient and a time-varying $B_0$ oscillation are determined according to the following relationships:

$$\gamma \Delta G(t) = \frac{f_1(t) - f_2(t) - f_3(t) + f_4(t)}{4\Delta Z}$$

$$\gamma \Delta B(t) = \frac{f_1(t) + f_2(t) - f_3(t) - f_4(t)}{4}$$

where $f_n(t)$ represents a time-varying precessing frequency of a spin-echo signal; $\Delta G(t)$ and $\Delta B(t)$ are, respectively, the time-varying field gradient and time-varying $B_0$ oscillation produced by eddy currents; and $\gamma$ is a gyromagnetic ratio value of a n appropriate nuclear species.

13. In an MRI system having a background static magnetic field, $B_0$, and gradient coils to induce switched gradients in the static field, a method for compensating eddy current (EC) effects and $B_0$ oscillations produced during an MRI sequence, comprising the steps of:

a) determining quantified values for an EC gradient and a $B_0$ oscillation induced by a switched gradient within the MRI system, wherein quantitative values for an EC gradient and a $B_0$ oscillation are determined according to the following two relationships:

$$\gamma \Delta G(t) = \frac{f_1(t) - f_2(t) - f_3(t) + f_4(t)}{4\Delta Z}$$

$$\gamma \Delta B(t) = \frac{f_1(t) + f_2(t) - f_3(t) - f_4(t)}{4}$$

where $f_n(t)$ represents time-varying precessing frequency of said spin-echo signal; $\Delta G(t)$ and $\Delta B(t)$ are, respectively, the EC gradient and $B_0$ oscillation produced by an eddy current; $\gamma$ is a gyromagnetic ratio value of an appropriate nuclear species; and quantitative values for precessing frequencies of spin-echo signals are determined from acquired NMR signal data samples according to the following relationships:

$$f_n(i) = \frac{u(i)\dot{v}(i) - v(i)\dot{u}(i)}{u^2(i) + v^2(i)}$$

with $$u(i) = \frac{S_n^u(i+1) + S_n^u(i)}{2}$$

$$v(i) = \frac{S_n^v(i+1) + S_n^v(i)}{2}$$

$$\dot{u}(i) = \frac{S_n^u(i+1) - S_n^u(i)}{\Delta t}$$

$$\dot{v}(i) = \frac{S_n^v(i+1) - S_n^v(i)}{\Delta t}$$

where $f_n(i)$ for n=1, 2, 3, 4 represents precessing frequencies of four NMR signals corresponding to said first and second pair of spin-echo signals; i for i=0,1, 2, . . . N−2 represents a particular data sample with N being a predetermined number of data samples acquired from a spin-echo NMR signal; $S_n^u$ and $S_n^v$ are real and imaginary parts of complex NMR signal data acquired; $\dot{u}(i)$ and $\dot{v}(i)$ are corresponding time derivatives of u(i) and v(i), respectively; and $\Delta t$ is a sampling rate for acquiring NMR signal data;

b) pre-distorting a gradient pulse waveform of a predetermined MRI sequence based on a quantified value for the EC gradient determined in step (a) such that a resultant gradient field produced during the sequence is appropriately compensated against the effects of any gradient switching induced eddy current; and c) producing a counter-oscillating $B_0$ field based on a quantified value for $B_0$ oscillation determined in step (a) to yield a stable $B_0$ field.

14. In an MRI system having a background static magnetic field, $B_0$, and gradient coils to induce switched gradients in the static field, a method for quantitating background static field gradient, comprising the steps of:

a) placing an MR active test object at a center of an imaging volume of the MRI system and aligning the object along the measurement direction;

b) applying a first gradient pulse to a gradient coil and acquiring signal data samples from a first pair of spin-echo NMR signals corresponding to two slices located symmetrically apart along said measurement direction away from a center of the magnetic field $B_0$;

c) applying a second gradient pulse to the gradient coil, the second gradient pulse having a polarity opposite to the first gradient pulse, and acquiring signal data samples from a second pair of spin-echo NMR signals corresponding to the slices of step (b);

d) determining four precessing frequencies, $f_1$–$f_4$, from acquired signal data samples of each spin-echo signal of said first and second pair of spin-echo NMR signals; and e) quantifying a background gradient, $\overline{G}_Z$, from the precessing frequencies determined in step (d) according to the following relationship:

$$\overline{G}_Z = \frac{f_1 - f_2 + f_3 - f_4}{4\Delta Z}.$$

15. A method as in claim 14 wherein quantitative values for precessing frequencies of spin-echo signals are determined from acquired NMR signal data samples according to the following relationships:

$$f_n(i) = \frac{\dot{u}(i)v(i) - \dot{v}(i)u(i)}{u^2(i) + v^2(i)}$$

with $$u(i) = \frac{S_n^u(i+1) + S_n^u(i)}{2}$$

$$v(i) = \frac{S_n^v(i+1) + S_n^v(i)}{2}$$

$$\dot{u}(i) = \frac{S_n^u(i+1) - S_n^u(i)}{\Delta t}$$

$$\dot{v}(i) = \frac{S_n^v(i+1) - S_n^v(i)}{\Delta t}$$

where $f_n(i)$ for n=1, 2, 3, 4 represents precessing frequencies of four NMR signals corresponding to said first and second pair of spin-echo signals; i for i=0,1, 2, . . . N−2 represents a particular data sample with N being a predetermined number of data samples acquired from a spin-echo NMR signal; $s_n^u$ and $s_n^v$ are real and imaginary parts of complex NMR signal data acquired; $\dot{u}(i)$ and $\dot{v}(i)$ are corresponding time derivatives of u(i) and v(i), respectively; and $\Delta t$ is a sampling rate of acquired NMR signal data.

16. A method for evaluating and compensating for large background static field gradients occurring during EC measurements or MRI sequences, comprising the steps of:
a) determining quantitative values of a background field gradient present within an EC measurement area due to $B_0$ field inhomogeneities and other static field gradients within an MRI apparatus; and
b) applying small opposing field gradients of equal magnitudes along directions corresponding to the background field gradient and other static field gradients.

17. A method as in claim 16 wherein an asymmetric (ASE) MRI pulse sequence is used for obtaining NMR signals and quantitative values for background static field gradient are determined according to the following two relationships:

$$S^+(Z) = \rho(Z)e^{-i\gamma \overline{G}_Z Z \Delta T}e^{-i\phi^0(Z)}$$

$$S^-(Z) = \rho(Z)e^{-i\gamma \overline{G}_Z Z \Delta T}e^{-i\phi^0(Z)}$$

where $\rho(Z)$ is spin distribution of the selected line; $\overline{G}_Z$ is static background field gradient along a measuring or readout direction (in this case designated as the "Z" axis); $\phi_0(Z)$ is phase contribution from error attributed to mis-tuning of the readout gradient and signal phases are a function of spatial position along a readout direction according to the following two relationships:

$$\phi^+(Z) = \gamma \overline{G}_Z Z \Delta T + \phi_o(Z)$$

$$\phi^-(Z) = \gamma \overline{G}_Z Z \Delta T - \phi_o(Z)$$

and the background field gradients are determined from the signal phases according to the following relationship:

$$\overline{G}_Z = \frac{\phi^+ \phi^-}{2\Delta T}$$

where $\phi^+$ and $\phi^-$ are spatial derivatives of the signal phases along the selected readout direction; and $\Delta T$ is an amount of time shift of the ASE signals from the spin-echo positions.

* * * * *